US010522333B2

(12) United States Patent
Sakka et al.

(10) Patent No.: US 10,522,333 B2
(45) Date of Patent: Dec. 31, 2019

(54) VACUUM PROCESSING APPARATUS

(71) Applicant: Hitachi High-Technologies Corporation, Tokyo (JP)

(72) Inventors: Yusaku Sakka, Tokyo (JP); Hiromichi Kawasaki, Tokyo (JP); Tsutomu Iida, Tokyo (JP); Hiromitsu Terauchi, Tokyo (JP); Masahiro Nagatani, Tokyo (JP); Yasushi Sonoda, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 160 days.

(21) Appl. No.: 15/708,449

(22) Filed: Sep. 19, 2017

(65) Prior Publication Data

US 2018/0151336 A1 May 31, 2018

(30) Foreign Application Priority Data

Nov. 29, 2016 (JP) .................................. 2016-230716

(51) Int. Cl.
*H01J 37/32* (2006.01)
*H01L 21/67* (2006.01)
*H01L 21/677* (2006.01)

(52) U.S. Cl.
CPC .... *H01J 37/32899* (2013.01); *H01J 37/3244* (2013.01); *H01J 37/32183* (2013.01); *H01J 37/32568* (2013.01); *H01J 37/32834* (2013.01); *H01L 21/67017* (2013.01); *H01L 21/6719* (2013.01); *H01L 21/67173* (2013.01);

(Continued)

(58) Field of Classification Search
None
See application file for complete search history.

(56) References Cited

U.S. PATENT DOCUMENTS 5,855,681 A 1/1999 Maydan et al.
2002/0190051 A1* 12/2002 Wang .................. C23C 16/0209
219/390

(Continued)

FOREIGN PATENT DOCUMENTS

CN 101523569 A 9/2009
JP 2013-179309 A 9/2013

(Continued)

OTHER PUBLICATIONS

Korean Office Action received in corresponding Korean Application No. 10-2017-0112453 dated Aug. 13, 2018.

(Continued)

*Primary Examiner* — Joseph A Miller, Jr.
(74) *Attorney, Agent, or Firm* — Mattingly & Malur, P.C.

(57) ABSTRACT

A vacuum processing apparatus includes a vacuum processing chamber, an upper electrode, a lower electrode, a first high-frequency power source, a second high-frequency power source, a first matching box, a second matching box, a copper plate for connecting an electrode shaft of the lower electrode with the second matching box, a drive base on which the electrode shaft of the lower electrode and the second matching box are mounted, a drive unit for ascending or descending the drive base, and an exhaust unit disposed at a position equally distanced from an exhaust outlet by a distance.

13 Claims, 7 Drawing Sheets

(52) U.S. Cl.
CPC .. *H01L 21/67196* (2013.01); *H01L 21/67201* (2013.01); *H01L 21/67769* (2013.01)

(56) References Cited

U.S. PATENT DOCUMENTS

| | | | |
|---|---|---|---|
| 2006/0005856 A1* | 1/2006 | Sun | B08B 7/0035 |
| | | | 134/1.1 |
| 2008/0053818 A1* | 3/2008 | Ui | H01J 37/32091 |
| | | | 204/164 |
| 2008/0110859 A1 | 5/2008 | Koshiishi et al. | |
| 2009/0242132 A1* | 10/2009 | Sato | H01J 37/32091 |
| | | | 156/345.43 |
| 2011/0265951 A1 | 11/2011 | Xu et al. | |
| 2015/0000843 A1 | 1/2015 | Koshiishi et al. | |
| 2015/0371876 A1 | 12/2015 | Terauchi et al. | |
| 2016/0027667 A1 | 1/2016 | Sadjadi et al. | |

FOREIGN PATENT DOCUMENTS

| | | |
|---|---|---|
| JP | 2016-9733 A | 1/2016 |
| KR | 10-2009-0057088 A | 6/2009 |
| KR | 10-2013-0031236 A | 3/2013 |
| TW | 201611082 A | 3/2016 |

OTHER PUBLICATIONS

Taiwanese Office Action received in corresponding Taiwanese Application No. 106133048 dated Oct. 29, 2018.

\* cited by examiner

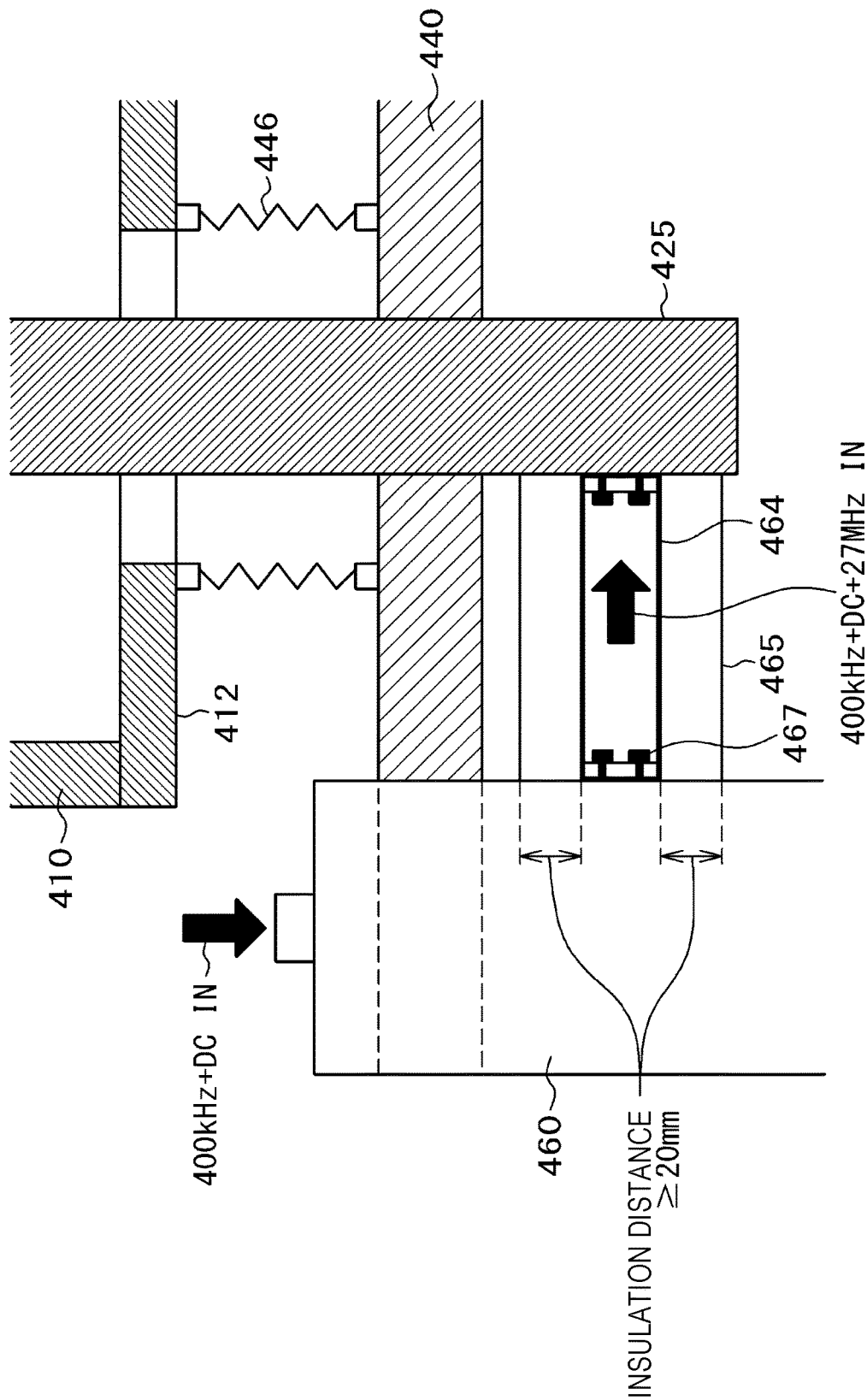

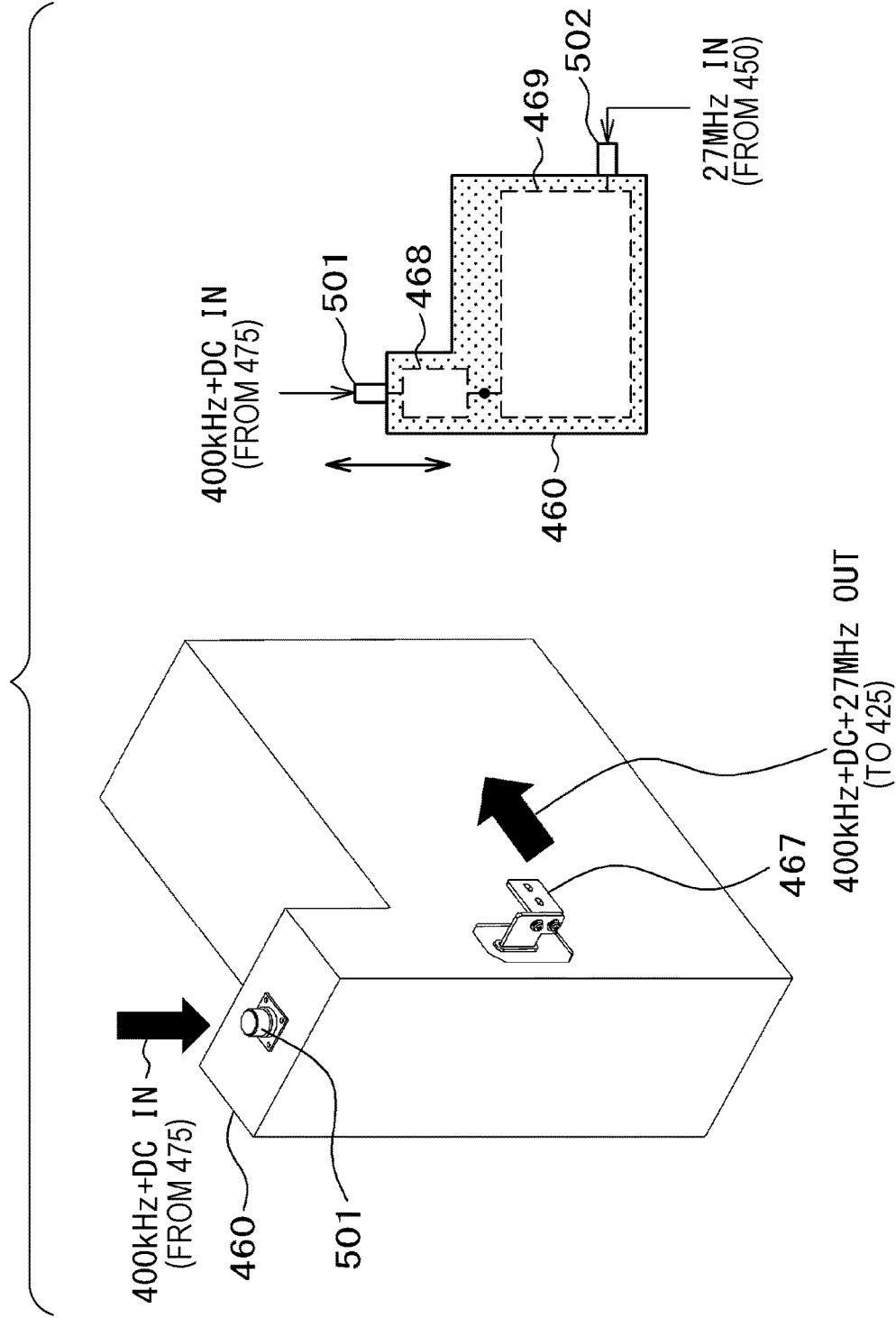

VACUUM PROCESSING APPARATUS

BACKGROUND OF THE INVENTION

1. Field of the Invention

The present invention relates to a vacuum processing apparatus.

2. Description of the Related Art

Vacuum processing apparatuses are used in the manufacturing process of semiconductor devices for surface treatment of wafers using plasma. For example, JP2013-179309 A discloses a wafer processing apparatus to provide a high-throughput wafer processing apparatus. The wafer processing apparatus includes a loadlock chamber, a transfer chamber, one or more processing chambers each forming two or more processing regions which are connected to the transfer chamber and spatially isolated from each other, and a first wafer handler housed in the transfer chamber. The processing chamber is configured to carry out a plurality of separate processes concurrently in at least two processing regions (dual chamber system). The wafer processing apparatus can process at least two wafers simultaneously in the processing chamber in accordance with advanced processing control that is achieved using shared gas sources, shared exhaust systems, separate gas distribution assemblies, separate radio frequency (RF) power sources, and separate temperature control systems.

Using the dual chamber system disclosed in JP2013-179309 A, the vacuum processing apparatus can achieve high throughput. Inventors of the present invention have further studied this technique. As a result, it has been found that the wafers processed in two processing regions have variations in processing result (i.e., machine difference is recognized).

It is an object of the present invention to provide a vacuum processing apparatus including a dual chamber having a decreased machine difference for processing between the processing regions.

SUMMARY OF THE INVENTION

To achieve the above object, an embodiment of the present invention is a vacuum processing apparatus, including
a first processing unit, including
a first vacuum processing chamber having a first exhaust outlet,
a first upper electrode disposed over the first vacuum processing chamber and grounded,
a first lower electrode disposed in a lower portion of the first vacuum processing chamber and capable of ascending and descending,
a first high-frequency power source supplying first high-frequency power having a high frequency to the first lower electrode, and a second high-frequency power source supplying second high-frequency power having a second high frequency which is higher than the first high frequency to the first lower electrode,
a first matching box connected to the first high-frequency power source,
a second matching box connected to the first matching box and the second high-frequency power source, and
a first copper plate connecting a first electrode shaft of the first lower electrode with the second matching box,
the vacuum processing apparatus further including
a second processing unit having a shape and measurements identical to the shape and measurements of the first processing unit, including
a second vacuum processing chamber having a second exhaust outlet,
a second upper electrode disposed over the second vacuum processing chamber and grounded,
a second lower electrode disposed in a lower portion of the second vacuum processing unit,
a third high-frequency power source supplying the first high-frequency power having the first high frequency to the second lower electrode, and a fourth high-frequency power source supplying the second high-frequency power having the second high frequency which is higher than the first high frequency to the second lower electrode,
a third matching box connected to the third high-frequency power source,
a fourth matching box connected to the third matching box and the fourth high-frequency power source, and
a second copper plate connecting a second electrode shaft of the second lower electrode with the fourth matching box,
the vacuum processing apparatus further including
a drive base on which the first electrode shaft, the second electrode shaft, the second matching box, and the fourth matching box are mounted,
a drive unit configured to ascend and descend the drive base, and
an exhaust unit disposed at a position equally distanced from the first exhaust outlet and the second exhaust outlet.

The present invention provides a vacuum processing apparatus including a dual chamber having a decreased machine difference in processing between the processing regions.

BRIEF DESCRIPTION OF THE DRAWINGS

FIG. 6 is a schematic horizontal cross-sectional view (including a part of a lower electrode) taken along line C-C of FIG. 5; and FIG. 7 are views for explaining a matching box (MB) connected to the lower electrode of the vacuum processing unit of FIG. 2, in which a view on the left illustrates an overall schematic and perspective view and a view on the right illustrates a schematic block diagram of an internal circuit.

DESCRIPTION OF THE PREFERRED EMBODIMENTS

Inventors of the present invention have reviewed processing results of a vacuum processing apparatus of a dual chamber system to determine the reason for variations in the processing results of the processing regions with respect to an exhaust unit, a power input unit including MBs and wires, a drive unit such as a sample stage, a gas feeder, and so on. As a result, it has been found that the reason for the variations is in the exhaust unit, the power input portion, the drive unit such as a sample stage, and so on. The present invention has been made on the basis of this new finding.

In the following, an embodiment of the present invention will be described by referring to the accompanying drawings.

An embodiment of the present invention is described by referring to FIGS. 1 to 7.

Figure 1:
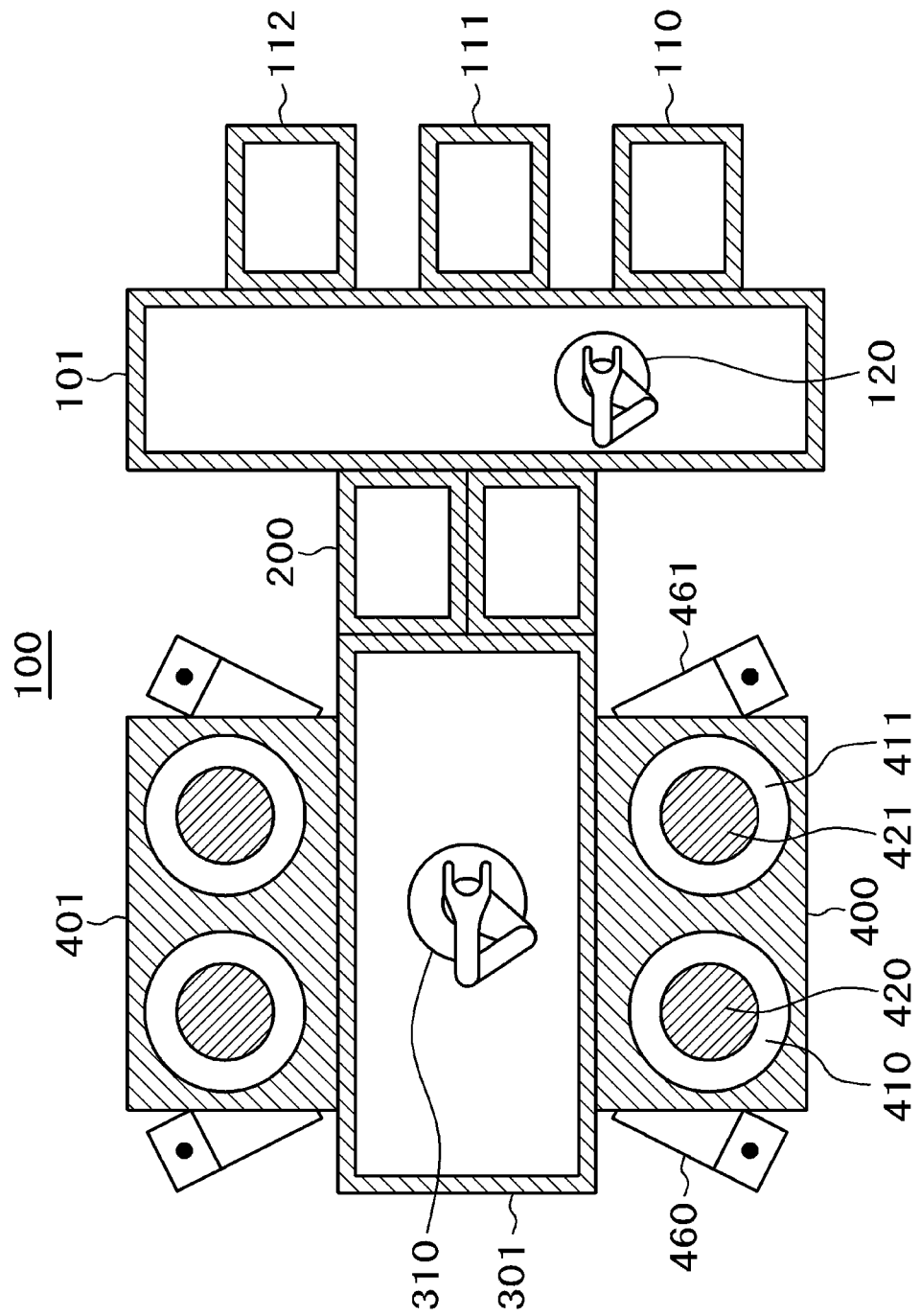
FIG. 1 is a schematic horizontal cross-sectional view (planar layout) of a vacuum processing apparatus according to an embodiment of the present invention.

FIG. 1 is a schematic horizontal cross-sectional view (planar layout) of a vacuum processing apparatus having two sets of dual plasma processing units according to an embodiment of the present invention. As illustrated in the drawing, a vacuum processing apparatus 100 having two sets of dual plasma processing units includes an atmospheric-side block (on the right side of the drawing), a vacuum-side block (on the left side of the drawing), and a loadlock chamber 200. The atmospheric-side block includes an atmospheric transfer chamber 101 and load ports 110, 111, and 112. The vacuum-side block includes a vacuum transfer chamber 301, a first dual-chamber vacuum processing unit 400, and a second dual-chamber vacuum processing unit 401. The loadlock chamber 200 connects the atmospheric-side block with the vacuum-side block to variably regulate (or decrease pressure of) the interior of the loadlock chamber 200 from the atmospheric pressure to a vacuum pressure. The atmospheric-side block is a part that carries out transfer, housing, positioning, and so on of an object to be processed (sample), such as a semiconductor wafer, under atmospheric pressure or an air pressure equivalent to the atmospheric pressure. The vacuum-side block is a part that carries out transfer, plasma processing, and so on of an object to be processed (sample), such as a wafer, under decreased pressure in order to increase or decrease the pressure with the sample mounted in place. The two loadlock chambers can be used such that one loadlock chamber is used for transferring the unprocessed wafer to the vacuum transfer chamber 301, while the other loadlock chamber is used for transferring the processed wafer to the atmospheric transfer chamber.

The atmospheric-side block includes the atmospheric transfer chamber 101 and the plurality of load ports 110, 111, and 112 which are attached on the front side of the atmospheric transfer chamber 101 for mounting cassettes each housing a sample to be processed or cleaned on the top surface of the load ports 110, 111, and 112. The atmospheric-side block is a part where the wafers to be processed or cleaned, which are housed in the cassettes and mounted on the load ports 110, 111, and 112, are transferred to and from the loadlock chamber 200 connected to the back of the atmospheric transfer chamber 101. The atmospheric transfer chamber 101 includes an atmospheric transfer robot 120 disposed in the atmospheric transfer chamber 101 for holding and transferring the wafers with an arm having a plurality of joints. The atmospheric transfer robot 120 may have a single arm, but if the arm is provided in upper and lower two levels, the atmospheric transfer robot 120 can increase the transfer speed of the wafers from the atmospheric transfer chamber to the loadlock chamber 200 or from the loadlock chamber 200 to the load ports 110, 111, and 112 via the atmospheric transfer chamber.

The vacuum-side block includes a plurality of dual-chamber vacuum processing units 400 and 401 for processing the samples under decreased pressure, and a vacuum transfer chamber 301 connected to the dual-chamber vacuum processing units 400 and 401 and including a vacuum transfer robot 310 for transferring the samples in the vacuum processing units. Also provided are a first vacuum processing chamber 410, a second vacuum processing chamber 411, a first sample stage (lower electrode) 420, a second sample stage (lower electrode) 421, a first MB 460 for 27 MHz, and a second MB 461 for 27 MHz. Although no reference signs are given to the constituent components of the dual-chamber vacuum processing unit 401 in FIG. 1, the dual-chamber vacuum processing units 401 and 400 have identical configurations. Further, although the vacuum transfer robot 310 may have a single arm, if the arm is provided in upper and lower levels, the vacuum transfer robot 310 can increase a wafer transfer speed from the loadlock chamber 200 to the dual-chamber vacuum processing units 400 and 401 via the vacuum transfer chamber 301, or from the dual-chamber vacuum processing units 400 and 401 to the loadlock chamber 200 via the vacuum transfer chamber 301. The vacuum-side block is configured such that an internal pressure of the vacuum-side block is reduced to maintain a high vacuum state.

In the present embodiment, operations of the constituent components of the vacuum processing apparatus 100, such as the atmospheric transfer robot or the vacuum transfer robot, or the operations of the vacuum processing apparatus, such as processing in the vacuum processing chamber, are carried out in accordance with an instruction signal from a control apparatus, which is not illustrated, connected to these components.

Figure 2:
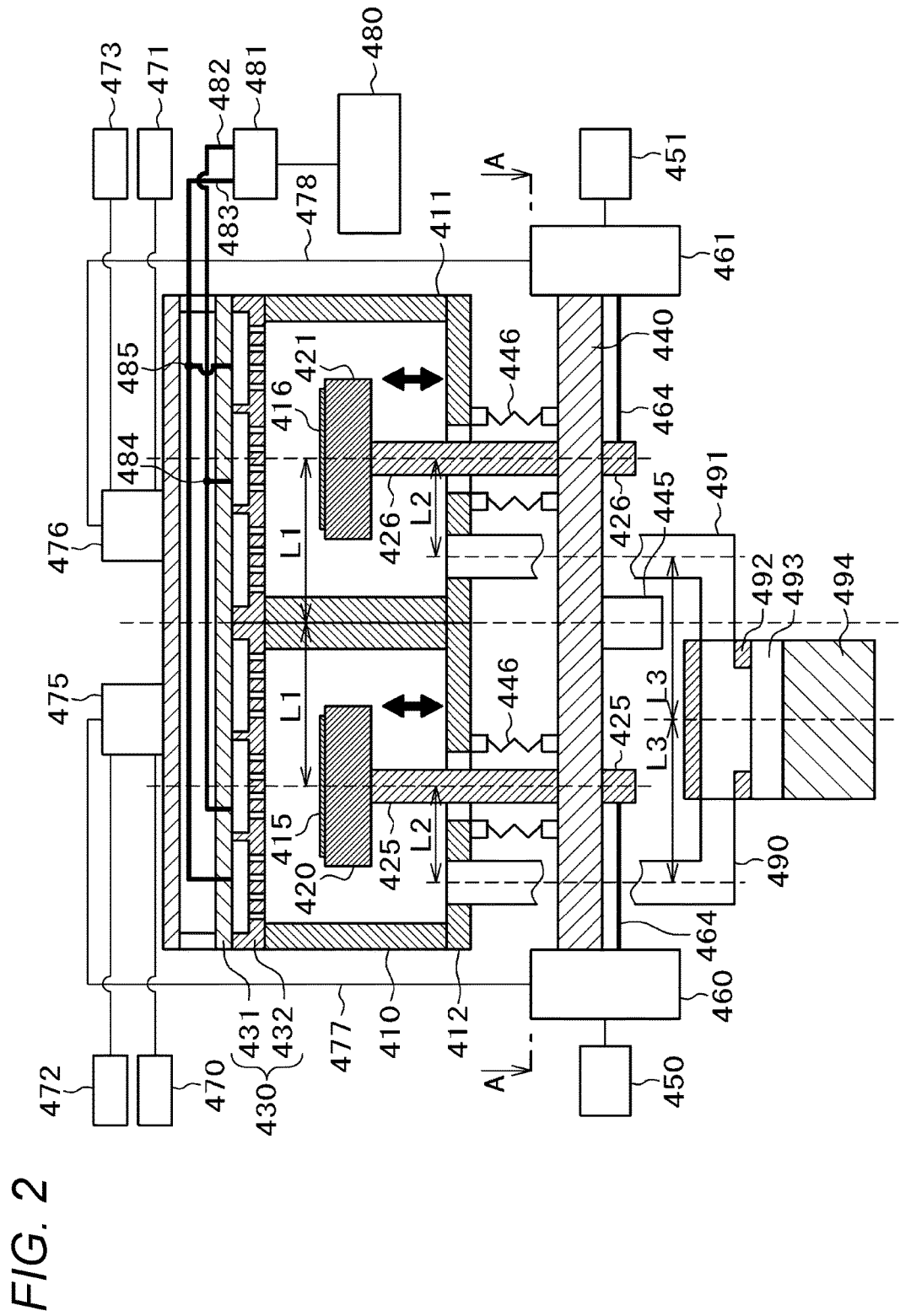
FIG. 2 is a vertical cross-sectional view (partially illustrated in blocks) of main components of a vacuum processing unit of the vacuum processing apparatus illustrated in FIG. 1.

Referring to FIG. 2, the configuration of the vacuum processing unit of the vacuum processing apparatus according to the present embodiment is described in detail. FIG. 2 is a vertical cross-sectional view (partially illustrated in blocks) of main components of a vacuum processing unit of the vacuum processing apparatus according to the present embodiment. In particular, FIG. 2 explains one of a plurality of vacuum processing units each including dual chambers (first and second vacuum processing chambers arranged in parallel with each other) in the vacuum processing apparatus. Other vacuum processing units including dual chambers also have similar components. Such vacuum processing units including dual chambers process film structures each having a plurality of film layers formed on semiconductor wafers, which are identical or can be regarded as identical, under particular conditions of pressure, flow rate of processing gases, compositions, and so on, which are identical or can be regarded as identical. Needless to say, the dual chambers (the first and second vacuum processing chambers arranged adjacent to each other) in one vacuum processing unit have the same shape and measurements within the range of accuracy of fabrication. Although the dual chambers (the first and second vacuum processing chambers) in the vacuum processing unit carry out the same processing, a plurality of vacuum processing units, if provided, can carry out different kinds of processing. In addition, the vacuum transfer chamber 301 of the present embodiment is formed in a box shape in a planar view, but may also be formed in a polygonal shape other than the box shape in a planar view to allow a larger number of vacuum processing units to be disposed one at each side (surface) of the vacuum transfer chamber 301 other than the side facing the loadlock chamber.

In FIG. 2, the vacuum processing chambers 410 and 411, which form the vacuum processing unit, include an upper electrode 430 which is grounded as a part of a vacuum container. The upper electrode 430 includes an upper lid 431 having a gas supply inlet and disposed over the upper end portion of a cylindrical side wall of the vacuum container with its top opened, and a gas distribution plate 432 having a plurality of inlet holes for introducing a processing gas into each of the vacuum processing chambers 410 and 411. The vacuum processing chambers 410 and 411, which form the space for generating plasma inside the side wall, are formed by sealing the interior and the exterior of the vacuum container in an airtight manner by connecting a sealing member, such as an O-ring which is not illustrated, between the upper end portion of the side wall of the vacuum container and the bottom surface of the outer periphery of the gas distribution plate 432.

The processing gas introduced into the vacuum processing chambers 410 and 411 is supplied from a gas feeder 480 via a gas distributor 481. For example, a first gas pipe 482 and a second gas pipe 483 are used to supply the gas from the gas distributor 481 to the upper lid 431. Preferably, in this case, the first gas pipe 482 is connected to internal space formed inside the gas distribution plate 432 of the vacuum processing chambers 410 and 411 by branching the first gas pipe 482 at a bifurcation 484, so that a pipe distance between the bifurcation 484 and the first vacuum processing chamber 410 can be equal to a pipe distance between the bifurcation 484 and the second vacuum processing chamber 411. Similarly, the second gas pipe 483 is preferably connected to space formed outside the gas distribution plate 432 of the vacuum processing chambers 410 and 411 by branching off the second gas pipe 483 at a bifurcation 485, so that a pipe distance between the bifurcation 485 and the first vacuum processing chamber 410 can be equal to a pipe distance between the bifurcation 485 and the second vacuum processing chamber 411. Thus, a machine difference in gas supply can be decreased. In addition, a total length of the pipe can be decreased by disposing the bifurcations closer to the vacuum processing chambers. The processing gas supplied through the upper lid 431 is introduced into the vacuum processing chamber through the plurality of gas inlet holes formed in the gas distribution plate 432. If the distance of the first or second gas pipe is substantially shorter than the distance from the bifurcation to each vacuum processing chamber, the difference of distance from the bifurcation to each vacuum processing chamber can be ignored and the distances of the gas pipes are not necessarily equal to each other.

In the first vacuum processing chamber 410, a first sample stage (lower electrode) 420 is disposed facing the upper electrode 430 in a coaxial and parallel manner. A sample 415 is mounted on the first sample stage 420 which stores a metal electrode and capable of ascending/descending. In the second vacuum processing chamber 411, a second sample stage (lower electrode) 421 is disposed facing the upper electrode 430 in a coaxial and parallel manner. A sample 416 is mounted on the second sample stage 421 which stores a metal electrode and capable of ascending/descending (thus forming a parallel planar electrode). A shaft of the sample stage (first electrode shaft) 425 for the first sample stage 420 and a shaft of the sample stage (second electrode shaft) 426 for the second sample stage 421 are both mounted on the same drive base 440. Each shaft of the sample stages includes, inside the shaft, a power supply cable for the lower electrode. The drive base 440 ascends or descends by a drive unit (motor) 445 disposed in the middle of the first and second vacuum processing chambers 410 and 411. Accordingly, the two sample stages 420 and 421 ascend or descend simultaneously in accordance with the ascending or descending of the drive base 440. The sample stages 420 and 421 move in a direction indicated by two-headed arrows in bold lines. Namely, two samples are concurrently processed in the first and second vacuum processing chambers 410 and 411 (concurrent processing). Use of a single (shared) drive unit can decrease the machine difference, if any, which would occur between the first and second vacuum processing chambers when two motors having the machine difference are used. In addition, the use of a single motor can make the motor occupying region be compact.

The first sample stage (lower electrode) 420 receives a high frequency power of, for example, 27 MHz for generating plasma, a high frequency power of, for example, 400 kHz for drawing ions in the plasma to the wafer to be processed, and direct current (DC) power for electrostatically adsorbing the wafer to be processed on the sample stage. High frequency power of 27 MHz is supplied to the lower electrode (first sample stage) 420 from a first high-frequency power source 450 for 27 MHz via a first MB 460 for 27 MHz having a cuboid shape. High frequency power of 400 kHz and the DC power are supplied to the lower electrode (first sample stage) 420 from a first high-frequency power source 470 for 400 kHz and a first DC power source 472 via a first MB 475 for 400 kHz, a connection cable 477, and the first MB 460 for 27 MHz. Although 27 MHz is precisely 27.12 MHz, 27 MHz is used herein for the sake of convenience.

Similar to the first sample stage 420, the second sample stage (lower electrode) 421 receives the high frequency power of 27 MHz for generating plasma, the high frequency power of 400 kHz for drawing ions in the plasma to the wafer to be processed, and the DC power for electrostatically adsorbing the wafer to be processed on the sample stage. The high frequency power of 27 MHz is supplied to the lower electrode (second sample stage) 421 from a second power source 451 for 27 MHz via the second MB 461 for 27 MHz. The high frequency power of 400 kHz and the DC power are supplied to the lower electrode (second sample stage) 421 from the second high-frequency power source 471 for 400 kHz and the second DC power source 473 via a second MB 476 for 400 kHz, a connection cable 478, and the second MB 461 for 27 MHz. The first and second sample stages 420 and 421 are equally distanced from the border between the first and second vacuum processing chambers 410 and 411 by a distance L1 (symmetrical arrangement).

Figure 3:
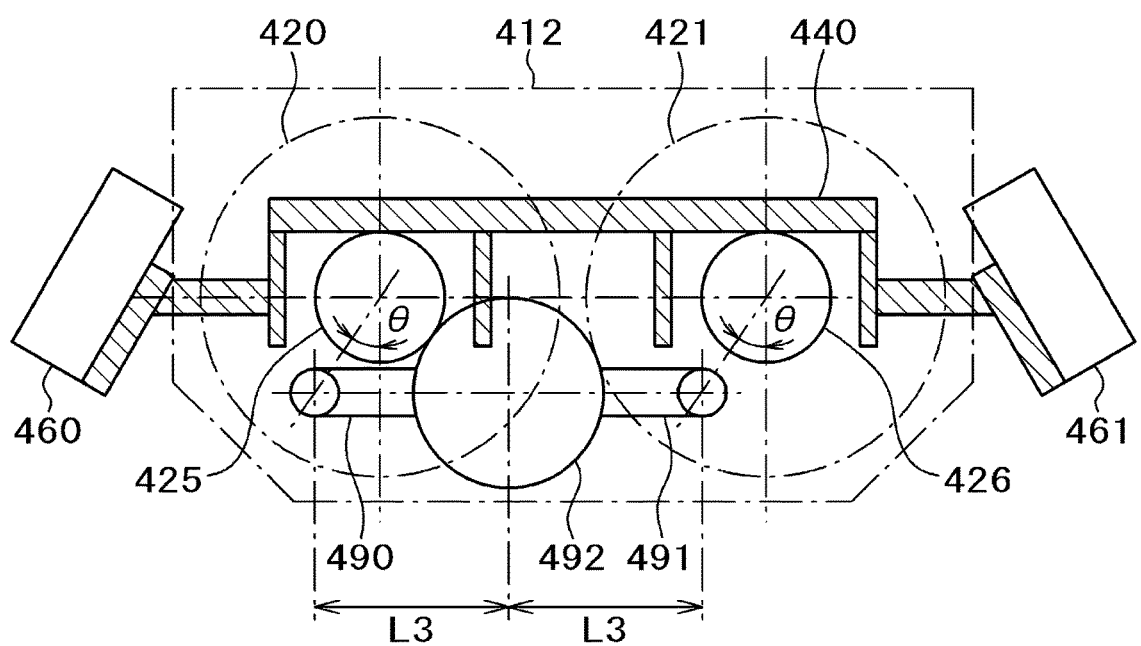
FIG. 3 is a schematic horizontal cross-sectional view taken along line A-A of FIG. 2.
Figure 4:
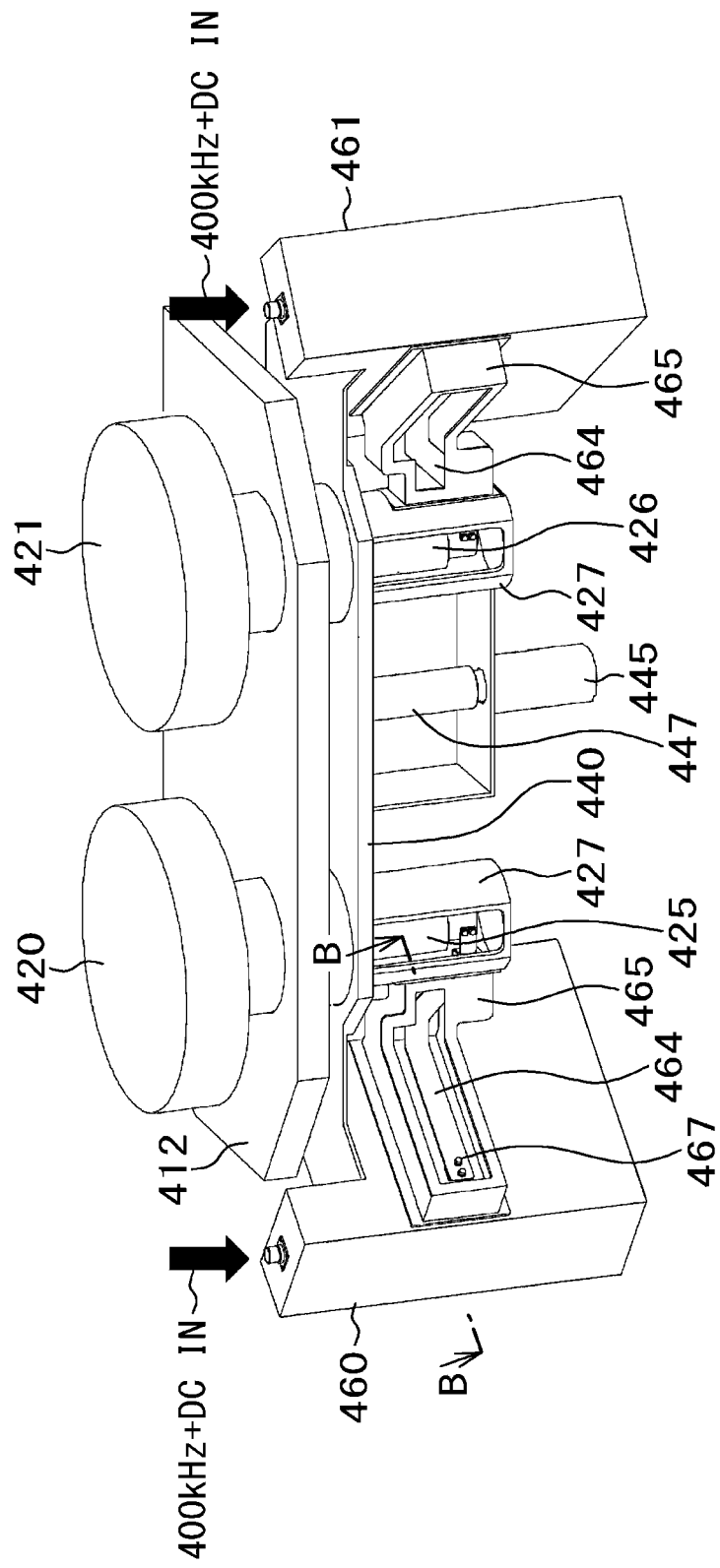
FIG. 4 is a schematic perspective view of main components of the vacuum processing unit of FIG. 2.
Figure 5:
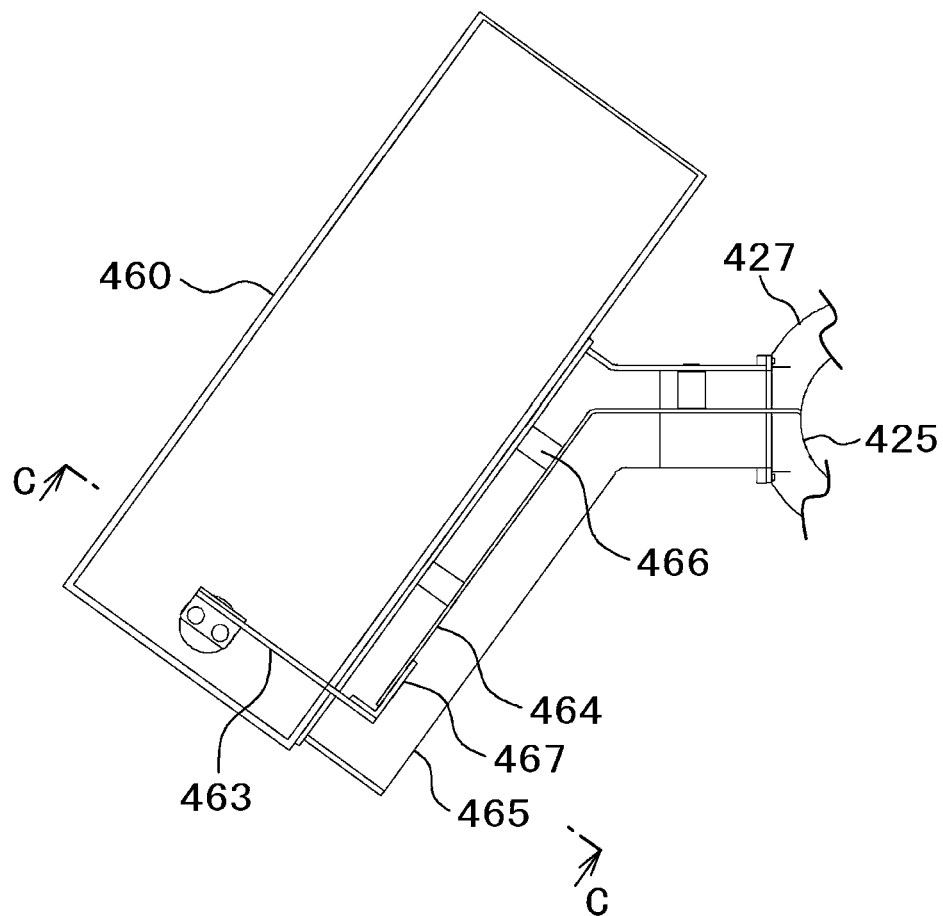
FIG. 5 is a schematic horizontal cross-sectional view taken along line B-B of FIG. 4.

The first MB 460 for 27 MHz and the second MB 461 for 27 MHz are disposed on both ends of the drive base 440 on which the first and second electrode shafts 425 and 426 of the lower electrodes 420 and 421, respectively, are mounted, and mutually engaging each other. FIG. 3 is a horizontal cross-sectional view (planar layout) taken along line A-A of FIG. 2 (although the drive unit is not illustrated). FIG. 4 is a perspective view of a portion surrounding the drive base (although an exhaust unit is not illustrated). FIG. 5 is a schematic horizontal cross-sectional view (planar layout) taken along line B-B of FIG. 4. FIG. 6 is a schematic vertical cross-sectional view taken along line C-C of FIG. 5. As illustrated in FIGS. 2 to 4, the MBs 460 and 461 are disposed on both ends of the drive base 440, so that, in the first vacuum processing chamber 410, the first MB 460 for 27 MHz and the lower electrode 420 including the first electrode shaft 425 can ascend or descend simultaneously with ascending or descending of the drive base 440. Thus, a constant distance is provided between the first MB 460 for 27 MHz and the first electrode shaft 425, and a copper plate 464 that does not easily deform can be used to connect between the first MB 460 for 27 MHz and the first electrode shaft 425. As a result, variations in impedance caused by deformation of the connection can be decreased, when compared to the case where a flexible connection is used between the first MB 460 for 27 MHz and the first electrode shaft 425. This improves reproducibility or stability of the generated plasma regardless of ascending or descending of the first sample stage (lower electrode) 420. Meanwhile, the first MB 460 for 27 MHz and the second MB 461 for 27 MHz are suspended from the drive base 440, so that the MBs can be disposed at the same height as the drive unit. Thus, the measurement of the MBs can be reduced in a height direction compared to a case where the MBs are disposed on the drive base. In a planar view of the dual-chamber vacuum processing unit, the MBs 460 and 461 are disposed in such a manner that at least part of, or preferably an input terminal portion of each of the MBs 460 and 461 sticks out from side faces of the vacuum processing chambers 410 and 411. This facilitates deformation of the connections and cables of the connection cable 477 between the first MB 475 for 400 kHz and the first MB 460 for 27 MHz. Things are the same in the second vacuum processing chamber side, and the description thereof is not repeated. A processing chamber base 412 and bellows 446 for sealing the outer periphery of each of the ascending or descending electrode shafts are also provided.

Meanwhile, the distance between the first MB 460 for 27 MHz and the first electrode shaft 425 is made equal to the distance between the second MB 461 for 27 MHz and the second electrode shaft 426, and the copper plate that is hardly deformable is used to connect between these components. This reduces a change in shape of the connections due to the ascending or descending, compared to the case where the flexible connection line is used, so that the machine difference between the first and second vacuum processing chambers can be decreased. The use of the copper plate can reduce the influence of heating (such as an increase of resistance value of wires) due to a good heat dissipation characteristic, even when the covered coaxial cable or the like is used.

As illustrated in FIGS. 4 to 6, the copper plate 464 of the present embodiment is wide in the height direction. Thus, an occupying area of the copper plate can be decreased. FIG. 4 illustrates an electrode shaft case 427. A drive shaft 447 is disposed in the center portion of the drive base. FIG. 5 illustrates a copper plate 463 in the second MB, a protection box 465 that is provided as a part of the power feed path and protects the copper plate from external force, a copper plate support (insulator) 466, and a joint 467 between the copper plate 463 in the second MB and the copper plate 464 connected to the first electrode shaft. The box 465 is insulated from the copper plate (power feed path) 464 and grounded. As illustrated in FIG. 6, the copper plate 464 is preferably separated from the box 465 by an insulation distance of at least 20 mm. Since the box 465 is disposed under the bottom surface of the drive base 440 below the processing chamber base 412, the box 465 would not contact an operator during maintenance work, such as atmospheric opening.

Further, the first and second MBs 460 and 461 for 27 MHz are disposed on both ends of the drive base 440, so that the exhaust unit can be provided in the region between the first and second MBs 460 and 461. This leads to a decrease of the distance to pull around the exhaust pipe, which is thicker than electric wires, and a decrease of an occupied region of the exhaust pipe. An exhaust conductance decreases, so that a small pump can be used. Thus, the occupied floor area of these components can be decreased. It is also possible to carry out maintenance work around the vacuum pump or ensuring housing space.

In the case where the high frequency power of 27 MHz, the high frequency power of 400 kHz, and the DC power are supplied to the sample stage (lower electrode), the upper electrode 430 can be at the ground potential. In this structure, a power supply line to the upper electrode is not necessary. Accordingly, the first and second MBs 475 and 476 for 400 kHz can be disposed above the upper electrode 430, thus decreasing the occupied floor area compared to the case where the first and second MBs 475 and 476 for 400 kHz are disposed along with other members under the first and second vacuum processing chambers 410 and 411.

Next, the MB for 27 MHz is described by referring to FIG. 7. Although the first MB 460 for 27 MHz is described herein, the basic structure is the same for both the second MB 461 for 27 MHz. FIG. 7 is an explanatory view for explaining the first MB for 27 MHz, in which a view on the left illustrates an overall schematic and perspective view and a view on the right illustrates a schematic block diagram of an internal circuit. The first MB 460 for 27 MHz includes a first input terminal 501 to which the high frequency power of 400 kHz from the first MB 475 for 400 kHz and the DC power are supplied, a second input terminal 502 (which is not illustrated in the view on the left) to which the first high frequency power for 27 MHz from the first high-frequency power source 450 for 27 MHz is supplied, and the copper plate joint (output terminal) 467 (which is not illustrated in the view on the right) that acts as an output terminal for supplying the high frequency power of 400 kHz, the DC power, and the high frequency power of 27 MHz to the first electrode shaft 425 of the first sample stage (lower electrode) 420.

The first input terminal 501 is provided on the top of the first MB for 27 MHz, because the first MB 475 for 400 kHz is disposed over the upper electrode 430. The output terminal 467 is disposed on the side of the first MB 460 for 27 MHz on the side of the first electrode shaft 425, in order to decrease the length of wiring between the first sample stage (lower electrode) 420 and the first electrode shaft 425. The second input terminal 502 may be disposed at a position which is not particularly limited, and is disposed on the side on which the output terminal 467 is not disposed in the present embodiment. In FIG. 7, the direction in which the first MB 460 for 27 MHz is moved in accordance with the ascending or descending of the drive base is indicated by a vertically-pointing two-headed arrow.

The first MB 460 for 27 MHz includes a 27 MHz cut filter 468 and a 400 kHz cut filter and a matching circuit (MC) 469 for 27 MHz. In the present embodiment, the 27 MHz cut filter 468 is disposed in the vicinity of the first input terminal. With the 27 MHz cut filter 468 in the first MB 460 for 27 MHz, occurrence of a reflected wave of 27 MHz is prevented between the first MB 475 for 400 kHz and the first MB 460 for 27 MHz, thus eliminating consideration of heating of the connection cable 477 (the connection cable 478 which is not provided on the side of the second vacuum processing chamber), thus allowing the use of the flexible coaxial cable as the connection cable 477 between the MBs in the present embodiment. The use of the flexible coaxial cable as the wiring between the MBs facilitates movement of the first MB 475 for 400 kHz and also facilitates maintenance work, although the first MB 475 for 400 kHz disposed over the upper electrode 430 needs to be moved during the maintenance work that involves opening or closing of the upper electrode.

Although the output from both the 400 kHz cut filter and the 27 MHz cut filter is connected to the copper plate connection terminal 467 so that the copper plate (power feed path) 464 can also act as the power feed path for 400 kHz and 27 MHz, the power feed path may be provided separately. In such a case, the distance between the 27 MHz cut filter 468 and the electrode shaft 425 on the 400 kHz power feed path does not change (decrease) by the vertical movement of the drive base. In the power feed path from the source of supply (e.g., the first high frequency power source 450 for 27 MHz) to the stage, the distance between the MB (e.g., the first MB 460 for 27 MHz) and the vertical shaft (e.g., the first electrode shaft 425) is fixed. At the same time, in the supply path of the power source for establishing a bias (e.g., the first high frequency power source 470 for 400 kHz) fixed at the position separated from the source of supply 450, the filter (e.g., the 27 MHz cut filter 468) and the vertical shaft 425 is fixed, and filter 468 is connected to the MB (e.g., the first MB 475 for 400 kHz) with the coaxial or flexible cable covered by a dielectric material.

An exhaust outlet of the first vacuum processing chamber 410 is, as illustrated in FIG. 2, disposed at a position away from the first electrode shaft 425 of the first sample stage 420 by a distance L2. An exhaust outlet of the second vacuum processing chamber 411 is disposed at a position separated from the second electrode shaft 426 of the second sample stage 421 by a distance L2. The exhaust outlets are, as illustrated in FIG. 3, disposed at similar positions of the first and second vacuum processing chambers 410 and 411 at positions away from the centers of the first and second electrode axes 425 and 426 by the same angle θ. These exhaust outlets are connected to a buffer chamber 492 via a first exhaust pipe 490 and a second exhaust pipe 491. The exhaust outlets are distanced from a shared exhaust unit including the buffer chamber 492, a pressure regulating valve 493, and an exhaust pump 494 by the identical distance L3 (see FIGS. 2 and 3). Thus, the center of the exhaust pump 494 is made to be eccentric relative to the center of the dual chamber vacuum processing unit, specifically toward left as illustrated in FIG. 2 herein. This allows space to be provided in the lower right side of the dual chamber vacuum processing unit as a space for disposing other devices not illustrated herein. This contributes to a decrease of footprint, that is, a decreased area, of the vacuum processing apparatus. The first and second sample stages 420 and 421, the first and second electrode shafts 425 and 426, and the buffer chamber 492 (exhaust unit) are formed in a circular shape in a planar view, as illustrated in FIG. 3.

Thus, it is possible to decrease the machine difference between the first and second vacuum processing chambers 410 and 411. The use of a single exhaust pump also allows the decrease of the machine difference between the first and second vacuum processing chambers 410 and 411, which might occur if two exhaust pumps having the machine difference are used. Further, the use of the single exhaust pump can achieve a compact occupied region of the exhaust pump.

When the plasma processing of a sample is carried out using the vacuum processing apparatus including the dual chamber of FIG. 1, it has been found that the variations in processing at each chamber is decreased (the machine difference is reduced) more largely than with the conventional vacuum processing apparatus.

According to the present embodiment described above, the vacuum processing apparatus including the dual chambers by which the machine difference in processing in each processing region is decreased can be provided. The apparatus can be made compact relative to the floor area by disposing the MB for 400 kHz over the upper earth electrode. Further, the compact apparatus can be achieved relative to the floor area by disposing the MBs for 27 MHz at both ends of the drive base with the exhaust unit being disposed between the MBs. The apparatus can be made compact also in the height direction by holding the MB for 27 MHz in a suspended manner. The machine difference can be decreased by branching the supply gas pipe at a position equally distanced from both the first and second vacuum processing chambers. In addition, the maintenance of the apparatus can be facilitated using the flexible coaxial cable between the MB for 400 kHz including the matching circuit for 400 kHz and the MB for 27 MHz including the matching circuit for 27 MHz, the 400 kHz cut filter, and the 27 MHz cut filter.

Although the 27 MHz frequency power source is used as the high frequency power source for generating plasma, while using the 400 kHz frequency power source as the high frequency power source for applying biases in the present embodiment, other frequencies may be used so long as the frequency can attain individual effect. Regarding the MBs attached to the drive base 440, if the high frequency power having different frequencies (not limited to the combination of frequencies for plasma generation and bias application) is applied to the sample stage, it is effective to provide the MBs for high frequencies with cut filters being provided for each frequency. If the high frequency power of three or more frequencies is applied to the sample stage, the high frequency power having the highest frequency needs to be considered.

The present invention is not limited to the embodiment described above, but may also include various other modifications. For example, the embodiment has been described in detail to facilitate the understanding of the present invention, and is not necessarily limited to the embodiment that includes the entire structure described above. The structure of the embodiment may partly be replaced by different constituent components having equivalent functions thereto, or other constituent components may be added to the structure of the embodiment described above.

What is claimed is:
1. A vacuum processing apparatus, comprising:
a first processing unit including:
a first vacuum processing chamber having a first exhaust outlet,
a first upper electrode disposed over the first vacuum processing chamber and grounded,
a first lower electrode disposed in a lower portion of the first vacuum processing chamber and capable of ascending and descending,
a first high-frequency power source configured to supply first high-frequency power having a first high frequency to the first lower electrode,
a second high-frequency power source configured to supply second high-frequency power having a second high frequency which is higher than the first high frequency to the first lower electrode,
a first matching box connected to the first high-frequency power source,
a second matching box connected to the first matching box and the second high-frequency power source, and
a first copper plate connecting a first electrode shaft of the first lower electrode with the second matching box;
a second processing unit having a shape and measurements substantially identical to the shape and measurements of the first processing unit, and including:
a second vacuum processing chamber having a second exhaust outlet, a second upper electrode disposed over the second vacuum processing chamber and grounded,
a second lower electrode disposed in a lower portion of the second vacuum processing unit and capable of ascending and descending,
a third high-frequency power source configured to supply the first high-frequency power having the first high frequency to the second lower electrode,
a fourth high-frequency power source configured to supply the second high-frequency power having the second high frequency which is higher than the first high frequency to the second lower electrode,
a third matching box connected to the third high-frequency power source,
a fourth matching box connected to the third matching box and the fourth high-frequency power source, and
a second copper plate connecting a second electrode shaft of the second lower electrode with the fourth matching box;
a drive base on which the first electrode shaft and the second electrode shaft are mounted, and each of the second matching box and the fourth matching box are respectively fixed at positions distanced from each of the first electrode shaft and the second electrode shaft, wherein a distance between the second matching box and the first electrode shaft and a distance between the fourth matching box and the second electrode shaft are equal;
a drive unit configured to ascending and descending the drive base; and
an exhaust unit disposed at a position equally distanced from the first exhaust outlet and the second exhaust outlet.

2. The vacuum processing apparatus according to claim 1, wherein
the first matching box is disposed over the first upper electrode, and
the third matching box is disposed over the second upper electrode.

3. The vacuum processing apparatus according to claim 1, wherein
a drive shaft of the drive unit is disposed in a center portion of the drive base, and
the second matching box and the fourth matching box are disposed on both ends of the drive base at positions equally distanced from the center portion of the drive base.

4. The vacuum processing apparatus according to claim 3, wherein
the second matching box and the fourth matching box are suspended from the drive base.

5. The vacuum processing apparatus according to claim 3, wherein
the exhaust unit is disposed between the second matching box and the fourth matching box.

6. The vacuum processing apparatus according to claim 1, further comprising:
a gas feeder configured to feed a gas to the first vacuum processing chamber and the second vacuum processing chamber, wherein
a gas pipe connected to the gas feeder is branched off at a position equally distanced to the first vacuum processing chamber and the second vacuum processing chamber.

7. The vacuum processing apparatus according to claim 1, wherein the second matching box and the fourth matching box each include both a first high-frequency cut filter for cutting the first high frequency to the second and fourth high-frequency power sources and a second high-frequency cut filter for cutting the second high frequency to the first and third high-frequency power sources.

8. The vacuum processing apparatus according to claim 7, wherein
the second high-frequency cut filter included in the second matching box and the fourth matching box is disposed near a connection terminal of the second matching box connected to the first matching box and near a connection terminal of the fourth matching box connected to the third matching box.

9. The vacuum processing apparatus according to claim 7, wherein
the first and second matching boxes are connected by a coaxial cable, and the third and fourth matching boxes are connected by a coaxial cable.

10. The vacuum processing apparatus according to claim 1, wherein
the first matching box and the third matching box are each connected to a direct current power source, and
the first matching box supplies direct current power to the first lower electrode via the second matching box, and the third matching box supplies direct current power to the second lower electrode via the fourth matching box.

11. The vacuum processing apparatus according to claim 1, wherein
the first copper plate and the second copper plate both are wide in a height direction.

12. The vacuum processing apparatus according to claim 1, wherein
the first copper plate is disposed in a first box with an insulation distance of at least 20 mm between the first box and the first copper plate, and
the second copper plate is disposed in a second box with an insulation distance of at least 20 mm between the second box and the second copper plate.

13. A vacuum processing apparatus comprising:
a load port on which a cassette storing a sample is mounted,
an atmospheric transfer chamber connected to the load port and including an atmospheric transfer robot,
a loadlock chamber connected to the atmospheric transfer chamber,
a vacuum transfer chamber connected to the loadlock chamber and including a vacuum transfer robot, and
a plurality of vacuum processing units including a first vacuum processing unit connected to the vacuum transfer chamber,
the first vacuum processing unit comprising:
a first processing unit including:
a first vacuum processing chamber having a first exhaust outlet,
a first upper electrode disposed over the first vacuum processing chamber and grounded,
a first lower electrode disposed in a lower portion of the first vacuum processing chamber and capable of ascending and descending,
a first high-frequency power source configured to supply first high-frequency power having a first high frequency to the first lower electrode,
a second high-frequency power source configured to supply second high-frequency power having a second high-frequency which is higher than the first high frequency to the first lower electrode, a first matching box connected to the first high-frequency power source,
a second matching box connected to the first matching box and the second high-frequency power source, and
a first copper plate connecting a first electrode shaft of the first lower electrode with the second matching box;
a second processing unit having a shape and measurements substantially identical to the shape and measurements of the first processing unit, and including:
a second vacuum processing chamber having a second exhaust outlet,
a second upper electrode disposed over the second vacuum processing chamber and grounded,
a second lower electrode disposed in a lower portion of the second vacuum processing unit and capable of ascending and descending,
a third high-frequency power source configured to supply the first high-frequency power having the first high frequency to the second lower electrode,
a fourth high-frequency power source configured to supply the second high-frequency power having the second high frequency which is higher than the first high frequency to the second lower electrode,
a third matching box connected to the third high-frequency power source,
a fourth matching box connected to the third matching box and the fourth high-frequency power source, and
a second copper plate connecting a second electrode shaft of the second lower electrode with the fourth matching box;
a drive base on which the first electrode shaft and the second electrode shaft are mounted, and each of the second matching box and the fourth matching box are respectively fixed at positions distanced from each of the first electrode shaft and the second electrode shaft, wherein a distance between the second matching box and the first electrode shaft and a distance between the fourth matching box and the second electrode shaft are equal;
a drive unit configured to ascend and descend the drive base; and
an exhaust unit disposed at a position equally distanced from the first exhaust outlet and the second exhaust outlet.

* * * * *